United States Patent
Cheng et al.

(10) Patent No.: US 11,236,418 B2
(45) Date of Patent: Feb. 1, 2022

(54) BOTTOM-UP GROWTH OF SILICON OXIDE AND SILICON NITRIDE USING SEQUENTIAL DEPOSITION-ETCH-TREAT PROCESSING

(71) Applicant: Applied Materials, Inc., Santa Clara, CA (US)

(72) Inventors: Rui Cheng, Santa Clara, CA (US); Abhijit Basu Mallick, Palo Alto, CA (US); Pramit Manna, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 115 days.

(21) Appl. No.: 16/853,689

(22) Filed: Apr. 20, 2020

(65) Prior Publication Data

US 2020/0248303 A1 Aug. 6, 2020

Related U.S. Application Data

(63) Continuation of application No. 16/001,258, filed on Jun. 6, 2018, now Pat. No. 10,626,495.

(60) Provisional application No. 62/516,069, filed on Jun. 6, 2017.

(51) Int. Cl.
| | |
|---|---|
| *H01L 21/02* | (2006.01) |
| *C23C 16/24* | (2006.01) |
| *C23C 16/04* | (2006.01) |
| *C23C 16/40* | (2006.01) |
| *C23C 16/34* | (2006.01) |
| *C23C 16/56* | (2006.01) |
| *H01L 21/762* | (2006.01) |

(52) U.S. Cl.
CPC ............ *C23C 16/24* (2013.01); *C23C 16/045* (2013.01); *C23C 16/345* (2013.01); *C23C 16/401* (2013.01); *C23C 16/56* (2013.01); *H01L 21/0217* (2013.01); *H01L 21/0228* (2013.01); *H01L 21/02164* (2013.01); *H01L 21/02211* (2013.01); *H01L 21/02274* (2013.01); *H01L 21/02337* (2013.01); *H01L 21/76227* (2013.01)

(58) Field of Classification Search
CPC ........... H01L 21/0234; H01L 21/02337; H01L 21/76224–76237
See application file for complete search history.

(56) References Cited

U.S. PATENT DOCUMENTS

| | | |
|---|---|---|
| 4,714,520 A | 12/1987 | Gwozdz |
| 5,915,191 A | 6/1999 | Jun |
| 6,706,634 B1 | 3/2004 | Seitz |
| 9,847,245 B1 | 12/2017 | Kittl et al. |
| 2001/0025971 A1 | 10/2001 | Powell |
| 2002/0137266 A1 | 9/2002 | Moon |
| 2007/0032092 A1 | 2/2007 | Shibata |
| 2007/0243692 A1 | 10/2007 | Rudeck et al. |
| 2007/0281495 A1 | 12/2007 | Abhijit |
| 2017/0004974 A1 | 1/2017 | Manna et al. |
| 2018/0033689 A1 | 2/2018 | Anthis et al. |
| 2018/0047567 A1 | 2/2018 | Kim |

*Primary Examiner* — Bryan R Junge
(74) *Attorney, Agent, or Firm* — - Servilla Whitney LLC

(57) ABSTRACT

Methods for gapfill of high aspect ratio features are described. A first film is deposited on the bottom and upper sidewalls of a feature. The first film is etched from the sidewalls of the feature and the first film in the bottom of the feature is treated to form a second film. The deposition, etch and treat processes are repeated to fill the feature.

20 Claims, 2 Drawing Sheets

BOTTOM-UP GROWTH OF SILICON OXIDE AND SILICON NITRIDE USING SEQUENTIAL DEPOSITION-ETCH-TREAT PROCESSING

CROSS-REFERENCE TO RELATED APPLICATIONS

This application claims is a continuation of U.S. patent application Ser. No. 16/001,258, filed Jun. 6, 2018, which claims priority to U.S. Provisional Application No. 62/516,069, filed Jun. 6, 2017, the entire disclosures of which are hereby incorporated by reference herein.

TECHNICAL FIELD

The present disclosure relates generally to methods for gapfill. In particular, the disclosure relates to processes to fill a gap using a sequential deposition-etch-treat process.

BACKGROUND

The gapfill process is a very important stage of semiconductor manufacturing. The gapfill process is used to fill a high aspect ratio gap (or feature) with an insulating or conducting material. For example, shallow trench isolation, inter-metal dielectric layers, passivation layers, dummy gate, etc. As device geometries shrink (e.g., critical dimensions<20 nm) and thermal budgets are reduced, void-free filling of high aspect ratio spaces (e.g., AR>10:1) becomes increasingly difficult due to limitations of conventional deposition processes.

Most deposition methods deposit more material on the top region than on the bottom region of a structure. The process often forms a mushroom shape film profile. As a result, the top part of a high aspect ratio structure sometimes pinches off prematurely leaving seams/voids within the structure's lower portions. This problem more prevalent in small features.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

Another approach to gapfill high AR features is by use of a flowable CVD process. A flowable CVD process usually requires complicated deposition-cure-treatment processing. Therefore, there is a need in the art for gapfill methods that can deposit films in high aspect ratio structures.

SUMMARY

One or more embodiments of the disclosure are directed to processing methods comprising providing a substrate having a substrate surface with a plurality of features formed therein. Each feature extends a distance from the substrate surface and having a bottom and at least one sidewall. A first film is deposited in the at least one feature so that the first film forms on the bottom of the feature and on the sidewalls of the feature near the substrate surface. The first film is etched from the sidewalls of the feature. The first film in the bottom of the feature is treated to form a second film in the feature.

Additional embodiments of the disclosure are directed to gapfill methods. A substrate having a substrate surface with a plurality of features formed therein is provided. Each feature extends a distance from the substrate surface and having a bottom and at least one sidewall. A first film comprising silicon is deposited in the at least one feature so that the first film forms on the bottom of the feature and on the sidewalls of the feature near the substrate surface. The first film is etched from the sidewalls of the feature. The first film in the bottom of the feature is treated to form a second film in the feature. The second film comprises one or more of silicon oxide, silicon nitride or silicon oxynitride.

Further embodiments of the disclosure are directed to gapfill methods comprising providing a substrate having a substrate surface with a plurality of features formed therein. Each feature extends a distance from the substrate surface and having a bottom and at least one sidewall. The substrate is exposed to a silicon precursor and a reactant to deposit a first film comprising silicon in the at least one feature so that the first film forms on the bottom of the feature and on the sidewalls of the feature near the substrate surface. The silicon precursor comprises one or more of silane, disilane, trisilane, tetrasilane, a higher order silane or dichlorosilane. The reactant comprises a plasma comprising one or more of hydrogen or nitrogen. The first film is formed to a depth in the range of about 1 Å to about 50 Å. The substrate is exposed to an etchant comprising a plasma comprising one or more of $H_2$, HCl or $Cl_2$ to etch the first film from the sidewalls of the feature. The first film in the bottom of the feature is treated to form a second film comprising one or more of silicon oxide, silicon nitride or silicon oxynitride in the feature. Treating the film comprises exposing the substrate to a plasma comprising one or more of Ar, He, $H_2$, $O_2$, $N_2O$, $O_3$, $H_2O$, $NH_3$ or $N_2$. The deposition, etch and treating processes are repeated to fill the feature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure advantageously provide methods of depositing a film (e.g., silicon) to fill a high aspect ratio feature. Some embodiments advantageously provide methods comprising cyclic deposition-etch-treatment processes that can be performed in a cluster tool environment. Some embodiments advantageously deposit silicon oxide (SiO), silicon nitride (SiN) and/or silicon oxynitride (SiON) gapfill films using a plasma-enhanced chemical vapor deposition (PECVD) processes. The skilled artisan will recognize that the formula SiO for silicon oxide does not imply a particular stoichiometric amount of silicon and oxygen atoms. Rather, the chemical formula for SiO, SiN, SiON, and others, merely indicates the identity of elements found in the subject film. The particular composition of the elements can vary.

Figure 1:
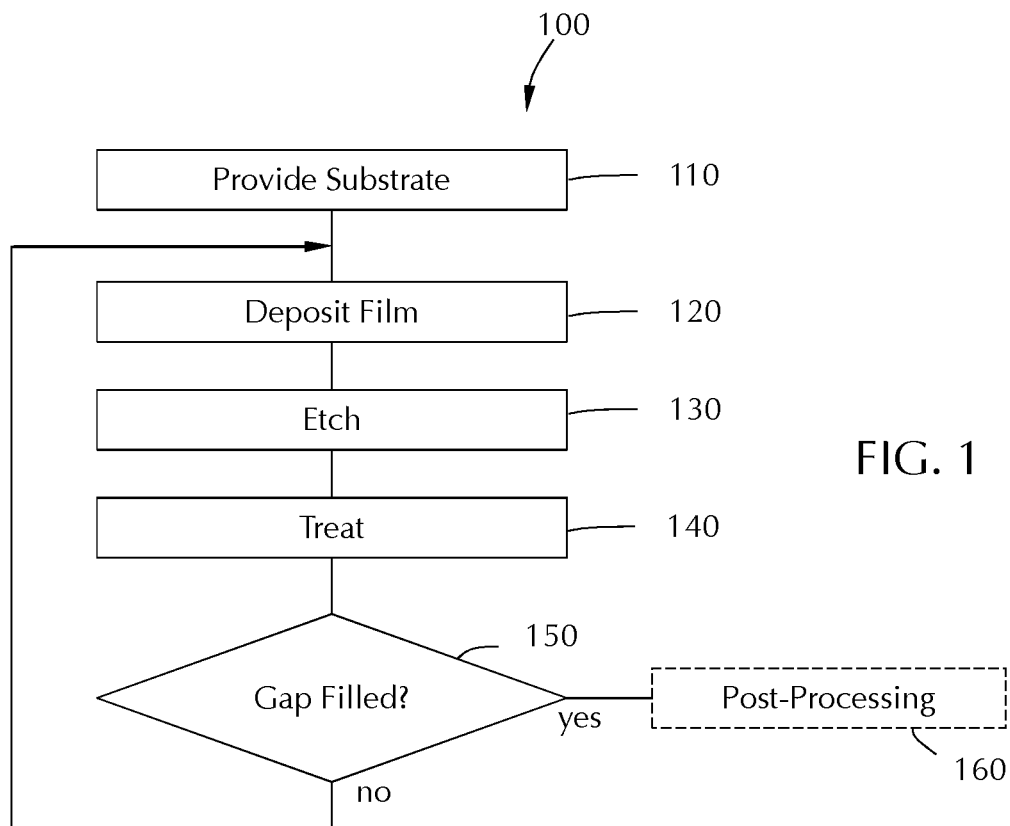
FIG. 1 illustrates a process flow in accordance with one or more embodiments of the disclosure.

FIG. 1 illustrates a broad view of a method 100 for depositing a film. FIGS. 2A through 2E illustrate the process of FIG. 1 using a schematic view of a substrate a film deposition.

At stage 110, a substrate 10 is provided for processing. As used in this regard, the term "provided" means that the substrate 10 is placed into a position or environment to deposit one or more films on the substrate 10. The substrate 10 has a substrate surface 12 with a plurality of features 14 formed therein. Each feature 14 extends a distance D from the substrate surface 12. Each feature has a bottom 16 and at least one sidewall 18. If the feature has a cylindrical shape there is one sidewall 18; however, viewed in cross-section, like that shown in FIG. 2A would appear to have two sidewalls. The number of sidewalls 18 is not limiting to the scope of the disclosure and any shape feature with any number of sidewalls could be used.

The distance D that the feature 14 extends from the surface 12 can be any suitable distance. The ratio of the distance D to the width of the feature 14 is referred to as the aspect ratio. In some embodiments, the feature 14 has a high aspect ratio greater than or equal to about 10:1, 15:1, 20:1, 25:1, 30:1, 35:1, 40:1, 45:1 or 50:1. In some embodiments, the feature has a low aspect ratio less than or equal to about 9:1, 8:1, 7:1, 6:1, 5:1, 4:1, 3:1 or 2:1.

The substrate 10 of some embodiments is a portion of a V-NAND device. The features 14 illustrated are shown as a recess in a unitary material so that the bottom 16 and sidewalls 18 are made of the same material. In some embodiments, the features are formed by alternating layers of different materials so that a first material is shorter than a second material to form the recess shape. In this type of system, the bottom of the feature is formed by the first material and the sidewall of the feature is formed by the taller second material. For example, a V-NAND structure made up of alternating layers of silicon oxide and silicon nitride films. Stated differently, in some embodiments, the feature is formed between two spaced layers (e.g., oxide layers) and the bottom of the feature is a material different from the spaced layers.

In some embodiments, a barrier layer (not shown) is formed on the surface. The barrier layer can be any suitable material including, but not limited to titanium nitride. The thickness of the barrier layer can be any suitable thickness. In some embodiments, the thickness of the barrier layer is in the range of about 10 Å to about 50 Å, or in the range of about 20 Å to about 45 Å, or in the range of about 30 Å to about 40 Å.

Figure 2A:
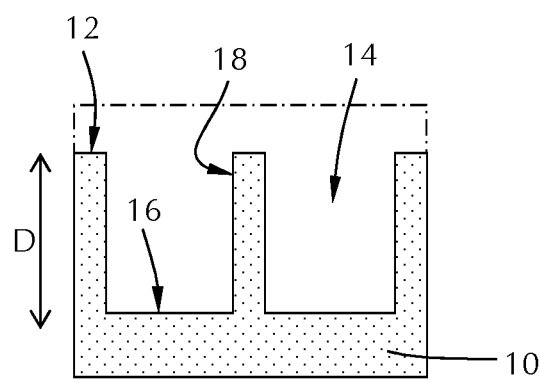
FIGS. 2A through 2E illustrate schematic representations of a substrate during the process flow of FIG. 1.
Figure 2B:
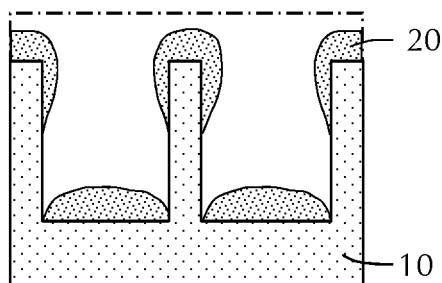

The gapfill method 100 moves to a deposition 120 process to begin filling the feature 14. Referring to FIG. 2B, a first film 20 is deposited in the at least one feature 14 so that the first film 20 forms on the bottom 16 and sidewalls 18 near the substrate surface 12. As used in this manner, the term "near the substrate surface" means that the first film 20 can form on the substrate surface 12 and on the upper portions of the sidewalls 18 of the feature 14. The depth to which the first film 20 forms on the sidewalls 18 of the feature can be any suitable depth and may vary with process conditions and film composition. Generally, the first film 20 forms a mushroom shape near the top of the feature adjacent the substrate surface 12 as illustrated in FIG. 2B.

The first film 20 can be any suitable material. In some embodiments, the first film 20 comprises silicon. In some embodiments, the first film 20 consists essentially of silicon. As used in this manner, the term "consists essentially of silicon" means that the film composition is greater than or equal to about 95%, 98% or 99% silicon on an atomic basis.

In some embodiments, depositing the first film 20 on the substrate 10 comprises exposing the substrate 10 to a silicon precursor and a reactant. In some embodiments, the silicon precursor comprises at least one species with the formula. In some embodiments, the silicon precursor comprises one or more of silane, disilane, trisilane, tetrasilane, a higher order silane or dichlorosilane. A higher order silane is defined as a silane compound having the empirical formula $Si_nH_{2n+2}$ where n is greater than or equal to 5. In some embodiments, the silicon precursor consists essentially of $SiH_4$. In some embodiments, the silicon precursor consists essentially of $Si_2H_6$. In some embodiments, the silicon precursor consists essentially of dichlorosilane, $SiH_2Cl_2$. As used in this manner, the term "consists essentially of" means that the silicon precursor is greater than or equal to about 95%, 98% or 99% of the stated species on a molar basis.

In some embodiments, the silicon precursor comprises a silicon halide species where the halogen atoms comprise one or more of F, Cl, Br and I. In some embodiments, the silicon halide comprises substantially no fluorine atoms. As used in this manner, the term "substantially no fluorine atoms" means that the composition of the halogen species is less than or equal to about 95%, 98% or 99% fluorine, on an atomic basis. The silicon precursor can be co-flowed with an inert, diluent or carrier gas. In some embodiments, the silicon precursor is co-flowed with one or more of argon or helium.

In some embodiments, the reactant comprises one or more of Ar, He, $H_2$ or $N_2$. The reactant and silicon precursor can be co-flowed into the processing chamber in a chemical vapor deposition (CVD) process. In some embodiments, the reactant and silicon precursor are sequentially exposed to the substrate surface without mixing in the gas phase in an atomic layer deposition (ALD) process.

In some embodiments, the deposition reactant comprises a deposition plasma that is exposed to the substrate concurrently with the silicon precursor in a plasma-enhanced CVD process, or sequentially with the silicon precursor in a plasma-enhanced ALD process.

In some embodiments, the deposition plasma comprises one or more of Ar, He, $H_2$ or $N_2$. In some embodiments, the deposition plasma consists essentially of Ar. In some embodiments, the deposition plasma consists essentially of He. In some embodiments, the deposition plasma consists essentially of $H_2$. In some embodiments, the deposition plasma consists essentially of $N_2$. As used in this manner, the term "consists essentially of" means that the deposition plasma is greater than or equal to about 95%, 98% or 99% of the stated species on an atomic basis.

The deposition plasma can be a conductively-coupled plasma (CCP) or inductively coupled plasma (ICP) and can be a direct plasma or a remote plasma. In some embodiments, the deposition plasma has a power in the range of about 0 W to about 2000 W. In some embodiments, the minimum plasma power is greater than 0 W, 10 W, 50 W or 100 W.

The temperature during deposition 120 can be any suitable temperature depending on, for example, the precursor(s) and/or deposition plasma(s) being used. In some embodiments, the deposition temperature is in the range of about 100° C. to 500° C., or in the range of about 150° C. to 450° C., or in the range of about 200° C. to about 400° C.

The processing chamber pressure during deposition 120 can be in the range of about 100 mTorr to 300 Torr, or in the range of about 200 mTorr to about 250 Torr, or in the range of about 500 mTorr to about 200 Torr, or in the range of about 1 Torr to about 150 Torr.

The film deposited can be any suitable thickness before moving to the etch process 130. In some embodiments, the thickness of the deposited first film 20 is in the range of about 0.1 Å to about 100 Å, or in the range of about 1 Å to about 50 Å. In some embodiments, the thickness of the deposited first film 20 is greater than or equal to about 5 Å, 10 Å, 15 Å, 20 Å or 25 Å before moving to the treatment process. In some embodiments, the thickness of the deposited first film 20 is less than or equal to about 100 Å, 90 Å, 80 Å, 70 Å, 60 Å or 50 Å before moving to the treatment process.

Figure 2C:
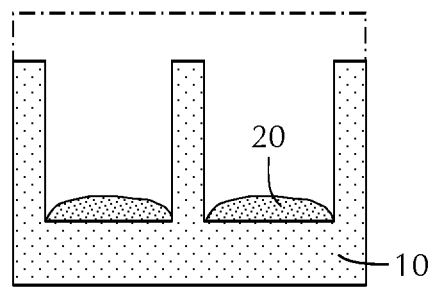
Figure 2D:
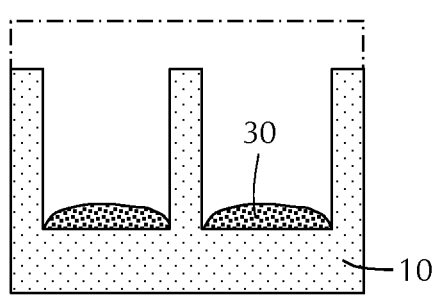

After deposition 120, the first film 20 is subjected to an etch process 130. With reference to FIG. 2C, the first film 20 is etched from the sidewalls 18 of the feature 14. The first film 20 remains in the bottom 16 of the feature 14. The amount of the first film 20 remaining in the bottom 16 of the feature 14 can vary based on, for example, the etch process conditions and the composition of the first film 20. In some embodiments, greater than or equal to about 10%, 20%, 30%, 40%, 50%, 60%, 70%, 80% or 90% of the deposited first film 20 remains after the etch process 130.

In some embodiments, etching the first film 20 from the sidewalls comprises exposing the substrate to one or more of $H_2$, HCl or $Cl_2$. In some embodiments, the first film 20 is etched to remove substantially all of the first film 20 from the sidewall and leave at least some of the silicon film on bottom of the feature. As used in this manner, the term "substantially all" means that greater than or equal to about 95%, 98% or 99% of the first film deposited on the substrate surface 12 is removed.

In some embodiments, the first film 20 is etched with a thermal etch process. In some embodiments, the thermal etch process is performed with an etchant comprising $H_2$. In some embodiments, an inert gas is co-flowed with the etchant during the thermal etch process.

In some embodiments, the first film 20 is etched with a plasma etch process. The plasma utilized in the plasma etch process is referred to as the etching plasma. In some embodiments, the etching plasma comprises one or more of $H_2$, HCl, $Cl_2$, or $NF_3$. In some embodiments, the etching plasma consists essentially of $H_2$. In some embodiments, the etching plasma consists essentially of HCl. In some embodiments, the etching plasma consists essentially of $Cl_2$. In some embodiments, the etching plasma consists essentially of $NF_3$. As used in this manner, the term "consists essentially of" means that the etching plasma is greater than or equal to about 95%, 98% or 99% of the stated species on an atomic basis. In some embodiments, an inert gas is co-flowed with the etching plasma during the plasma etch process.

The etching plasma can be a conductively-coupled plasma (CCP) or inductively coupled plasma (ICP) and can be a direct plasma or a remote plasma. In some embodiments, the plasma has a power in the range of about 0 to about 2000 W. In some embodiments, the minimum plasma power is greater than 0 W, 10 W, 50 W or 100 W.

The temperature during the etch process 130 can be any suitable temperature depending on, for example, the etch process, the etchant and/or the etching plasma(s) being used. In some embodiments, the etch temperature is in the range of about 100° C. to 500° C., or in the range of about 150° C. to about 450° C., or in the range of about 200° C. to about 400° C.

The processing chamber pressure during the etch process 130 can be in the range of about 100 mTorr to 300 Torr, or in the range of about 200 mTorr to about 250 Torr, or in the range of about 500 mTorr to about 200 Torr, or in the range of about 1 Torr to about 150 Torr.

After the etch process 130, the first film 20 is subjected to a treatment process 140. Treating the first film 20 forms a second film 30 in the feature 14. In some embodiments, the second film 30 is an oxide, nitride, boride, carbide, or combination thereof, of the first film 20. For example, in some embodiments, the first film 20 comprises or consists essentially of silicon and the second film comprises one or more of silicon oxide, silicon nitride or silicon oxynitride. In some embodiments, the second film consists essentially of silicon nitride. In some embodiments, the second film 30 consists essentially of silicon oxide. In some embodiments, the second film 30 consists essentially of silicon oxynitride. In some embodiments, the second film 30 consists essentially of silicon with one or more of boron, carbon, oxygen or nitrogen atoms. As used in this manner, the term "consists essentially of" means that the composition of the second film has a sum of the stated elements that is greater than or equal to about 95%, 98% or 99% of the total composition of the film, on an atomic basis.

In some embodiments, treating the first film 20 comprises exposing the first film 20 to one or more of Ar, He, $H_2$, $O_2$, $N_2O$, $O_3$ or $H_2O$ to form a second film 30 comprising silicon oxide. In some embodiments, treating the first film 20 comprises exposing the first film 20 to one or more of Ar, He, $H_2$, $NH_3$, $N_2$ to form a second film comprising silicon nitride. Other oxidizing agents and nitriding agents can also be used including, but not limited to, $H_2O_2$, hydrazine, hydrazine derivatives and combinations thereof.

In some embodiments, treating the first film 20 comprises exposing the first film 20 to a plasma comprising one or more of Ar, He, $H_2$, $O_2$, $N_2O$, $O_3$, $H_2O$, $NH_3$, $N_2$, $H_2O_2$, hydrazine or hydrazine derivatives. In some embodiments, the treatment plasma is the same as the deposition plasma. In some embodiments, the treatment plasma is different than the deposition plasma.

The treatment plasma can be a conductively-coupled plasma (CCP) or inductively coupled plasma (ICP) and can be a direct plasma or a remote plasma. In some embodiments, the plasma has a power in the range of about 0 to about 2000 W. In some embodiments, the minimum plasma power is greater than 0 W, 10 W, 50 W or 100 W.

The temperature during the treatment process 140 can be any suitable temperature depending on, for example, the treatment plasma(s) being used. In some embodiments, the treatment temperature is in the range of about 100° C. to 500° C., or in the range of about 150° C. to about 450° C., or in the range of about 200° C. to about 400° C.

The processing chamber pressure during the treatment process 140 can be in the range of about 100 mTorr to 300 Torr, or in the range of about 200 mTorr to about 250 Torr, or in the range of about 500 mTorr to about 200 Torr, or in the range of about 1 Torr to about 150 Torr.

Figure 2E:
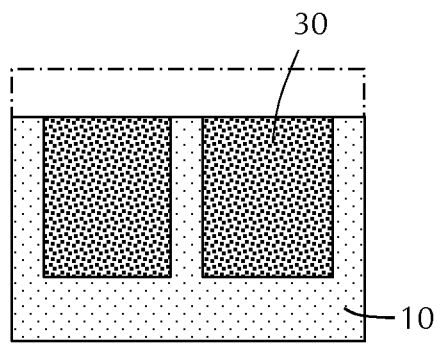

After the treatment process 140, the method 100 reaches decision point 150. If the gap has been filled with a predetermined thickness of the second film 30, the substrate optionally continues for post-processing at 160. If the second film 30 has not reached a predetermined thickness or has not filled the feature 14, the method returns to deposition 120 for at least one additional cycle of deposition 120, the etch process 130 and the treatment process 140. FIG. 2E illustrates a feature that has been filled with the second film 30 after multiple cycles through the deposition-etch-treat process.

Some embodiments include an optional post-processing 160 process. The post-processing 160 can be used to modify the deposited film or the substrate to improve some parameter of the film or substrate. In some embodiments, the post-processing 160 comprises annealing the film. In some embodiments, post-processing 160 can be performed by in-situ anneal in the same process chamber used for deposition 120, the etch process 130 or the treatment process 140. Suitable annealing processes include, but are not limited to, rapid thermal processing (RTP) or rapid thermal anneal (RTA), spike anneal, or UV cure, or e-beam cure and/or laser anneal. The anneal temperature can be in the range of about 500° C. to 900° C. The composition of the environment during anneal may include one or more of $H_2$, Ar, He, $N_2$, $NH_3$, $SiH_4$, etc. The pressure during the anneal can be in the range of about 100 mTorr to about 1 atm.

At any point during the methods described by this disclosure, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive gases, purge gases, reactants or plasmas. Rotating the substrate during processing (either continuously or in steps) may help produce a more uniform deposition, treatment or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in some embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method comprising:
depositing a first film in a substrate feature, the first film forming on a bottom of the feature and sidewall of the feature only on an upper portion of the sidewall adjacent a substrate surface, the feature extending a distance from the substrate surface, the feature formed between two spaced oxide layers so that the sidewalls of the feature are the oxide layers and the bottom of the feature is a different material than the spaced oxide layers;
etching the first film from the sidewalls of the feature; and
treating the first film in the bottom of the feature to form a second film in the feature.

2. The method of claim 1, wherein the spaced oxide layers are part of a V-NAND device structure.

3. The method of claim 2, wherein the first film comprises silicon.

4. The method of claim 3, wherein the second film comprises one or more of silicon oxide, silicon nitride or silicon oxynitride.

5. The method of claim 4, wherein depositing the first film comprises exposing the substrate surface to a silicon precursor and a reactant.

6. The method of claim 5, wherein the silicon precursor comprises one or more of silane, disilane, trisilane, tetrasilane, a higher order silane or dichlorosilane.

7. The method of claim 6, wherein the reactant comprises one or more of hydrogen or nitrogen.

8. The method of claim 7, wherein the reactant comprises a plasma.

9. The method of claim 4, wherein the first film is deposited at a pressure in the range of about 100 mTorr to about 300 Torr.

10. The method of claim 3, wherein etching the first film from the sidewalls comprises exposing the substrate to one or more of $H_2$, HCl or $Cl_2$.

11. The method of claim 1, wherein etching the first film comprises a plasma.

12. The method of claim 11, wherein the plasma comprises one or more of $H_2$, HCl, $Cl_2$ or $NF_3$.

13. The method of claim 1, wherein the first film is deposited to a thickness in the range of about 0.1 Å to about 100 Å before etching.

14. The method of claim 13, wherein after etching the first film from the sidewalls of the feature, greater than or equal to about 10% of the first film on the bottom of the feature remains.

15. The method of claim 3, wherein treating the first film comprises exposing the first film to one or more of Ar, He, $H_2$, $O_2$, $N_2O$, $O_3$ or $H_2O$ to form a second film comprising silicon oxide.

16. The method of claim 15, wherein treating the first film comprises exposing the first film to a plasma.

17. The method of claim 3, wherein treating the first film comprises exposing the first film to one or more of Ar, He, $H_2$, $NH_3$, $N_2$ to form a second film comprising silicon nitride.

18. The method of claim 1, wherein a process temperature during one or more of deposition, etching or treatment is in the range of about 150° C. to about 450° C.

19. The method of claim 1, further comprising repeating the deposition, etch and treatment to fill the feature with the second film.

20. The method of claim 1, further comprising modifying the second film by a post-processing treatment comprising annealing at a temperature in the range of about 500° C. to about 900° C.

* * * * *